United States Patent
Shenoy (10) Patent No.: US 10,416,226 B2
(45) Date of Patent: Sep. 17, 2019

(54) TEST RESPONSE COMPACTION SCHEME

(71) Applicant: GLOBALFOUNDRIES INC., Grand Cayman (KY)

(72) Inventor: Jaidev Udyavar Shenoy, Bengaluru (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 91 days.

(21) Appl. No.: 15/668,362

(22) Filed: Aug. 3, 2017

(65) Prior Publication Data

US 2019/0041453 A1 Feb. 7, 2019

(51) Int. Cl.
*G01R 31/3185* (2006.01)
*G01R 31/28* (2006.01)
*G01R 31/3183* (2006.01)
*G01R 31/317* (2006.01)
*G01R 31/3177* (2006.01)

(52) U.S. Cl.
CPC ... *G01R 31/2851* (2013.01); *G01R 31/31703* (2013.01); *G01R 31/318321* (2013.01); *G01R 31/318547* (2013.01); *G01R 31/3177* (2013.01); *G01R 31/318566* (2013.01)

(58) Field of Classification Search
CPC ..................................................... G06F 11/27
USPC ........................................................ 714/732
See application file for complete search history.

(56) References Cited

U.S. PATENT DOCUMENTS

| | | | |
|---|---|---|---|
| 7,509,551 B2 | 3/2009 | Koenemann et al. | |
| 7,853,848 B2 | 12/2010 | Desineni et al. | |
| 7,882,409 B2 | 2/2011 | Gizdarski | |
| 8,163,896 B1* | 4/2012 | Bentwich | C07K 14/4702 435/320.1 |
| 8,207,316 B1* | 6/2012 | Bentwich | C07K 14/005 536/23.1 |
| 9,250,287 B2 | 2/2016 | Mukherjee et al. | |
| 2004/0246337 A1* | 12/2004 | Hasegawa | G01R 31/318536 348/189 |

OTHER PUBLICATIONS

Rajski et al., "Convolutional Compaction of Test Responses", ITC International Test Conference IEEE, 2003, 10 pages.
(Continued)

*Primary Examiner* — Fritz Alphonse
(74) *Attorney, Agent, or Firm* — Michael Le Strange; Andrew M. Calderon; Roberts Mlotkowski Safran Cole & Calderon, P.C.

(57) ABSTRACT

The present disclosure relates to a test response compaction scheme and, more particularly, to a test response compaction scheme for integrated circuits with improved diagnostic capability and test time, with related structures and processes. The method includes: arranging bits of a memory cell into channels and clock cycles, wherein each clock cycle is assigned a successive prime number and each channel has a maximum chain length of "X" number of bits; performing a test by applying stimulus and capturing response in memory elements; scanning out test results of the test performed on the bits for each cycle and channel; calculating a final signature of the test results using the successive prime number and a weighting afforded to each channel; and identifying any failures of the bits by comparing the final signature to an expected signature.

20 Claims, 5 Drawing Sheets

(56) References Cited

OTHER PUBLICATIONS

Saleem et al., "Using Symbolic Canceling to Improve Diagnosis from Compacted Response", International Test Conference IEEE, Nov. 2016, 8 pages.

Rajski et al., "Test responses compaction in accumulators with rotate carry adders", IEEE Transactions on Computer-Aided Design of Integrated Circuits and Systems, vol. 12, Issue 4, Apr. 1993, 9 pages.

Cheng et al., "Signature Based Diagnosis for Logic BIST", International Test Conference IEEE, 2007, 9 pages.

* cited by examiner

FIG. 6

TEST RESPONSE COMPACTION SCHEME

FIELD OF THE INVENTION

The present disclosure relates to a test response compaction scheme and, more particularly, to a test response compaction scheme for integrated circuits (e.g., memory cells) with improved diagnostic capability and test time, with related structures and processes.

BACKGROUND

Manufacturing test involves testing complex circuits by applying stimulus and capturing responses in memory elements along with or without Built-In Self Tests (BIST) for memory cells. An important aspect of both these tests is response compaction in which the test response is compressed in both the space and time dimensions to a compact signature. Test response compaction schemes are typically based on XOR or multiple input signature register (MISR) schemes. MISR schemes, for example, can generate and store a resulting signature from test responses.

MISR has the advantage of having a memory and register, which can store the data of each cycle. By implementing the MISR, it is possible to make a comparison after all of the cycles have been scanned out. MISR poses several disadvantages, though. For example, with MISR schemes there can be poor diagnosability, faulty values which may be jumbled into the signature, as well as sequential and combinational overhead. In addition, there is low diagnostic resolution which does not allow for pinpointing the exact location of a failure; instead, it is only possible to identify a fault in the chip. Also, MISR schemes are not very scalable which leads to higher test time for a same number of scan outs.

On the other hand, by implementing the XOR schemes, it is possible to compare the signature of each cycle in order to isolate a failure and, hence have a higher diagnostic resolution. The XOR schemes also provide the following disadvantages: every cycle comparison leads to less efficient use of scan I/Os, aliasing effects occur when compression factor increases, also leading to higher test time because the number of signature comparison cycles will equal the length of scan segments. Also, XOR schemes are not scalable with respect to test time.

SUMMARY

In an aspect of the disclosure, a method comprises: arranging bits of a memory cell into channels and clock cycles, wherein each clock cycle is assigned a successive prime number and each channel has a maximum chain length of "X" number of bits; performing a test by applying stimulus and capturing response in memory elements; scanning out test results of the test performed on the bits for each cycle and channel; calculating a final signature of the test results using the successive prime number and a weighting afforded to each channel; and identifying any failures of the bits by comparing the final signature to an expected signature.

In an aspect of the disclosure, a method comprises: providing a column weight and a row weight for each column and row of bits of a memory cell; scanning out results of a first cycle of the memory cells; calculating a column value (C) and row value (R) for the first cycle; scanning out results of any additional cycles of the memory cells; calculating a column value (C) and row value (R) for each additional cycle; calculating a final signature from by multiplication and addition operations performed with the column values and the row values obtained in the calculating steps; and scanning out the final signature from the memory cells and comparing to an expected signature.

In an aspect of the disclosure, a method comprises: running a test on a memory cell or memory element to obtain signatures of bits after all clock cycles have been run; obtaining compacted signatures of test responses of the test run on the circuit or memory cell; determining a difference between the obtained signature and an expected signature to identify an existence of an error; and locating the memory cell or memory element capturing the faulty response by dividing the result by "2" until an odd number is obtained, wherein a number of divides is representative of a row number of the memory cell and an odd number is representative of a column number of a fail.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a test response compaction scheme and, more particularly, to a test response compaction scheme for integrated circuits (e.g., memory cells and memory elements) with improved diagnostic capability and test time, with related structures and processes. As used herein, a memory cell is a building block of a memory (e.g., RAMs, ROMs) and a memory element is mainly the flip flops in the design. During manufacturing test, the memory element is under test; whereas in BIST, the memory cell is under test. The present disclosure, advantageously, can provide improvements to both manufacturing test and BIST. For example, the present disclosure contemplates performing manufacturing test by applying stimulus and capturing response in memory elements (flip-flops), as well as performing a built-in test on the bits of the memory cell.

More specifically, the present disclosure provides a test response compaction method in which an exact position of a fault capturing flop (single faults) can be obtained directly from a signature difference, with possible positions obtained in case of multiple faults. Advantageously, the response compaction scheme described herein provides improved diagnosability and test time reduction for both manufacturing test and BIST.

In embodiments, the test response compaction scheme includes a structure comprising multipliers, adders, and prime numbers stored in a memory for the purpose of compaction of test response data captured in memory elements (flip-flops). The structure can also include pre-stored constants in a memory, shifters and adders for the purpose of compaction of test response data captured in the memory elements (flip-flops). In operation, the compaction scheme provides a method to compress/compact the test response data stored in the memory elements (flip-flops) using mathematical operations, e.g., multiplication, addition with prime numbers, etc. In addition, the method to generate a compacted response of test data stored in the memory elements can include applying weights involving the prime numbers. The new diagnostic method to identify flip-flops capturing faulty data can also include performing mathematical operations, e.g., subtraction and division on the compacted test response.

Figure 1:
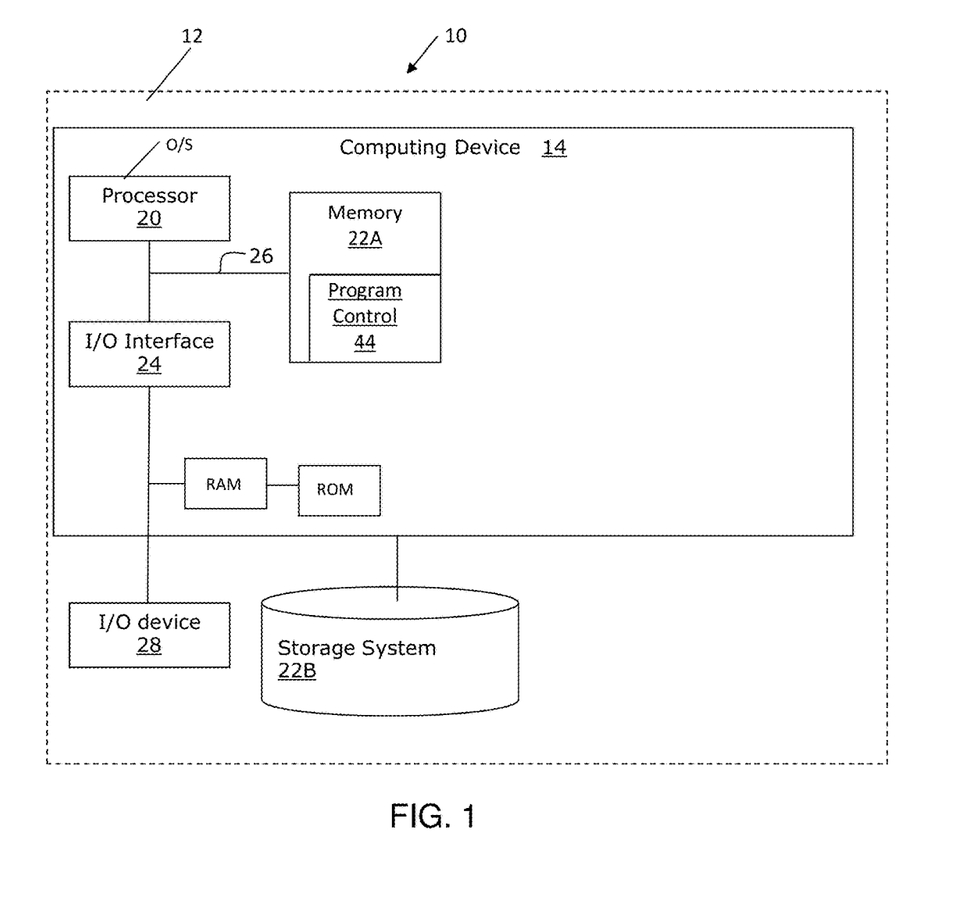
FIG. 1 is an illustrative environment for implementing the steps in accordance with aspects of the present disclosure.

FIG. 1 is an illustrative environment for implementing the steps in accordance with aspects of the disclosure. To this extent, the environment 10 includes a server 12 or other computing system that can perform the processes described herein, e.g., computations for fault analysis. In particular, the server 12 includes a computing device 14. The computing device 14 can be resident on a network infrastructure or computing device. The computing device 14 includes a processor 20 (e.g., CPU), memory 22A, an I/O interface 24, and a bus 26. The memory 22A can include local memory employed during actual execution of program code, bulk storage, and cache memories to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a keyboard, etc.

In general, the processor 20 executes computer program code (e.g., program control 44), which can be stored in the memory 22A and/or storage system 22B. Moreover, the program control 44 can implement the computations described herein, e.g., the processes described herein. The program control 44 can be implemented as one or more program code stored in the memory 22A as separate or combined modules. Additionally, the program control 44 may be implemented as separate dedicated processors or a single or several processors to provide the function of these tools. While executing the computer program code, the processor 20 can read and/or write data to/from the memory 22A, the storage system 22B, and/or I/O interface 24. The bus 26 provides a communications link between each of the components in computing device 14.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. Similarly, server 12 is only illustrative of various types of computer infrastructures for implementing the compaction scheme disclosed herein. For example, in embodiments, the server 12 comprises two or more computing devices (e.g., a server cluster) that communicate over any type of communications link, such as a network, a shared memory, or the like, to perform the process described herein.

The compaction scheme may also be implemented in a computer program product. The computer program product may include a computer readable storage medium (or media) having computer readable program instructions thereon for causing a processor to carry out aspects of the present invention. The computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Instead, the computer readable storage medium is a tangible object, which can retain and store instructions for use by computing device shown in FIG. 1. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing.

Figure 2:
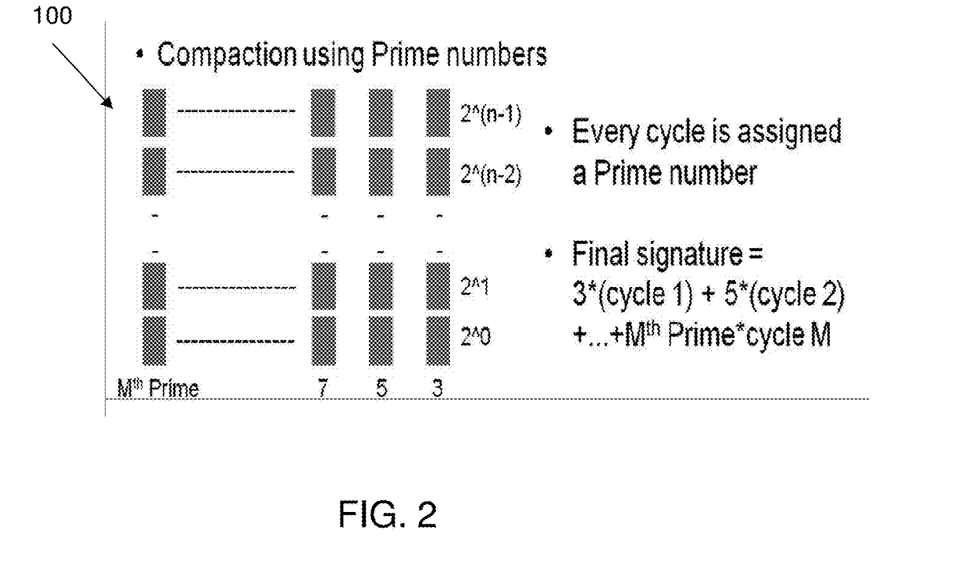
FIG. 2 shows a compaction scheme using prime numbers in accordance with aspects of the present disclosure.

FIG. 2 shows a compaction scheme implemented in a structure using prime numbers in accordance with aspects of the present disclosure. More specifically, FIG. 2 representatively shows a structure 100 of a memory block, e.g., flip-flop, used as data storage elements, which can implement the compaction scheme. In embodiments, the structure 100, e.g., flip-flop, a single bit (binary digit) stores data at each bit location of the block, with one of its two states representing a "1" and the other representing a "0". As should be understood by those of skill in the art, a single point of failure can be represented by, e.g., "0" (when expecting a "1") or vice versa.

In embodiments, the bits of the structure 100 (e.g., memory cell) are arranged in accordance with rows (channels) and columns (clock cycles), where each clock cycle (column) is assigned a prime number, e.g., 3, 5, 7, Mth prime number and each row is assigned a weighting. In embodiments, the prime number can also include a weighting, e.g., more emphasis placed on a particular column, etc.

It is contemplated herein that any number of rows and columns can be used without affecting test time or scan outs. For example, in the representative structures shown in FIGS. 5 and 6, there are nine (9) channels. Also, it should be understood by those of skill in the art that in alternative embodiments the rows can be assigned a prime number and the columns can be represented by an exponent on 2.

As further shown in FIG. 2, each row can have a maximum chain length of "X" number of bits which is represented by an exponent on 2 (e.g., non-prime number), where "n" represents the number of channels (rows) in a given memory under test and the "subtracter" portion of the equation represents remaining channels to be scanned out. For example, the fourth row of four rows would be represented as $2^{(n-1)}$, where n=4 and 1 is representative of one more row to be scanned out; whereas, the third row of four rows would be represented as $2^{(n-2)}$, where n=4 and 2 is representative of two more rows to be scanned out. In addition, row $2^0$ is, e.g., $2^{(4-4)}$, and row $2^1$ is $2^{(4-3)}$.

Still referring to FIG. 2, in operation, a manufacturing test can be performed by applying stimulus and capturing response in memory elements (flip-flops) and, after each cycle is scanned out, the results are compressed and added to the next cycle. In embodiments, it is also contemplated to perform a built-in test on the bits of the memory cell. And, after all of the cycles are scanned out, a final signature can be obtained to determine failures using the following equation:

Final Signature=3(cycle 1)+5(cycle 2)+$M^{th}$ prime number*cycle M.

As should be understood by those of skill in the art, cycle n equals the decimal representation of the binary value for that cycle. For example, if the cycle has 0111, then decimal representation would be=$0*(2^3)+1*(2^2)+1*(2^1)+1*(2^0)$ =0+4+2+1=7. Accordingly the value of that cycle is 7. Also, as discussed in more detail below, the signature, itself, can provide faulty flop locations, e.g., locate a memory cell or memory element capturing the faulty response, by comparing the final signature to an expected signature.

Figure 3:
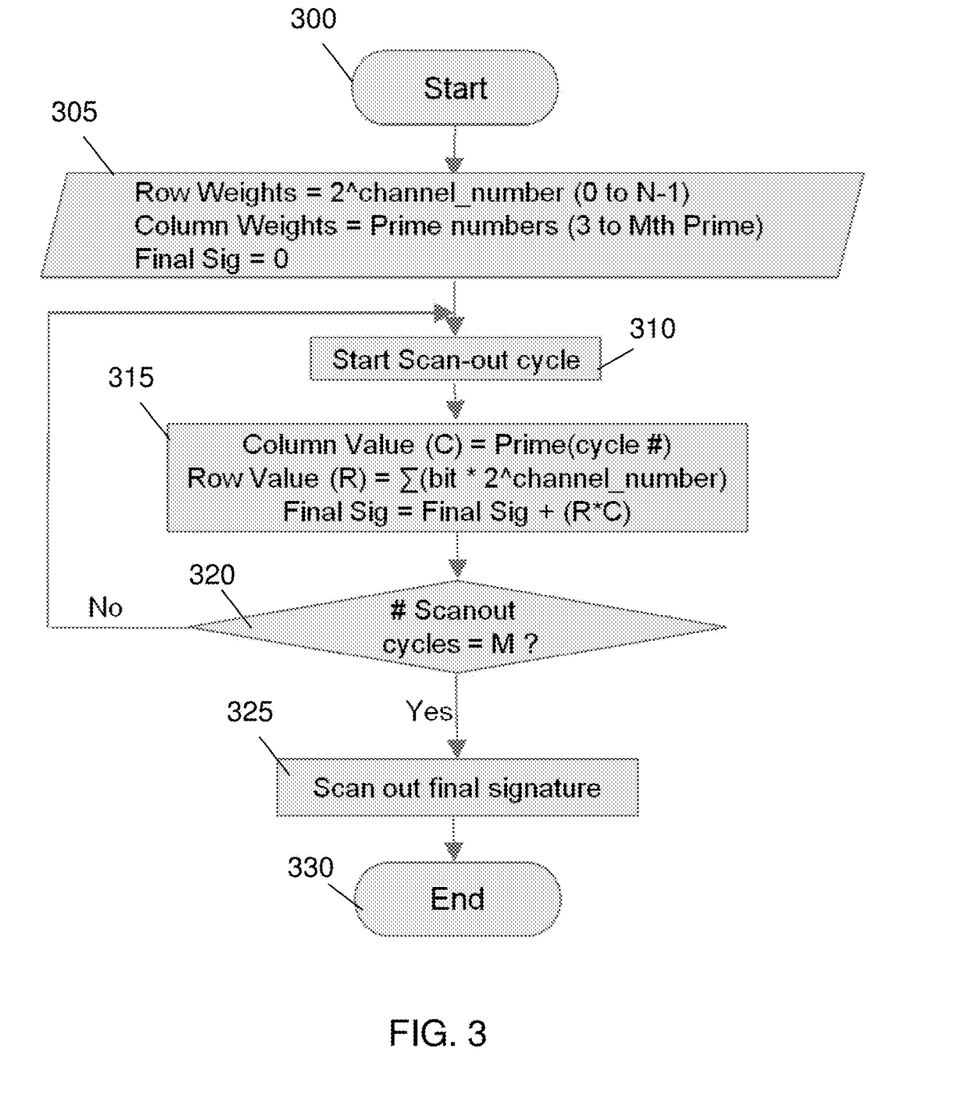
FIGS. 3 and 4 show exemplary process flows for performing processes in accordance with aspects of the present disclosure.
Figure 4:
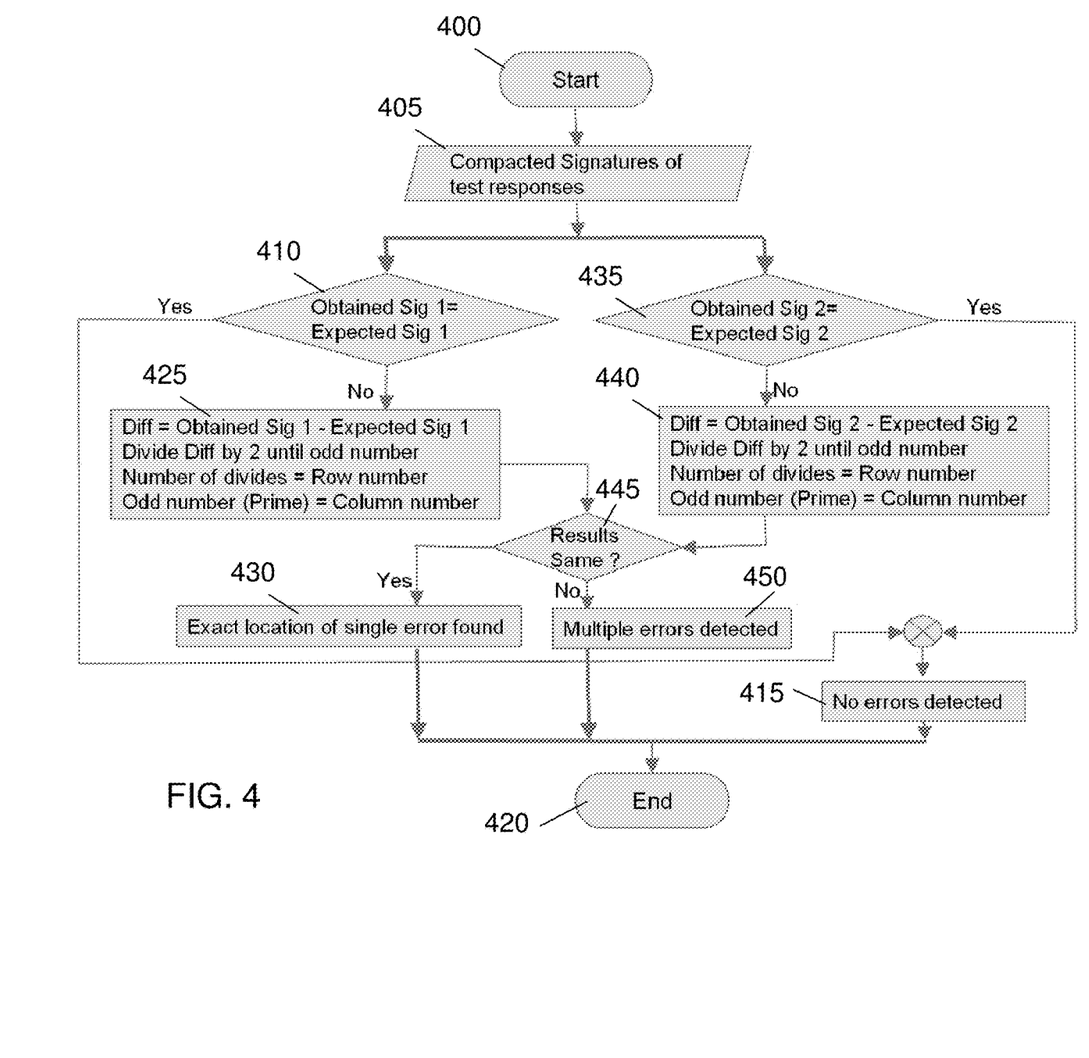

FIGS. 3 and 4 show exemplary process flows for performing processes in accordance with aspects of the present disclosure. The steps of FIGS. 3 and 4 may be implemented in the environment of FIG. 1, for example. The steps shown in the figures may be executed in parallel, resulting in a reduced number of cycles that significantly decrease test time as described in more detail herein. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The flowchart(s) illustrate the architecture, functionality, and operation of possible implementations of systems, methods, and computer program products according to various embodiments of the present disclosure.

Referring to FIG. 3, at step 300 the process begins. At step 305, the column and row weights are set with the final signature being initialized to "0" before the scan out starts. More specifically, the row weights are equal to 2 ˆ A channel number (0 to N−1); whereas, the column weights are equal to the prime numbers (3 to Mth prime number). At step 310, a scan out cycle begins. At step 315, a column value (C) and row value (R) are calculated. For example, the column value (C) is equal to a prime number for each cycle (e.g., Prime (cycle #)); whereas, the row value (R) is equal to Σbit value (e.g., "0" or "1")*2 ˆ channel number (for all flops in the column)). The channel number can vary from 0 to (N−1). The final signature is equal to the final signature noted at step 305 (e.g., "0", plus (R*C)). As should be understood, Prime(cycle #) is a representation of the prime number assigned to the cycle number, e.g., Prime(cycle 1)=3; Prime (cycle 2)=5, etc.

At step 320, a determination is made as to whether all of the cycles have been scanned out. If not, the process reverts back to step 310. If all of the cycles have been scanned out, at step 325, a final signature is scanned out. If the final signature is what was expected, there is no error in the captured response. In comparison, if the final signature is not what was expected, then a defect in the circuit, e.g., memory bank, is assumed to exist. The process ends at step 330.

FIG. 4 shows a failure detection process in accordance with additional aspects described herein. The process of FIG. 4 (e.g., signatures as described herein) can be used to determine an exact location of a single failure or, alternative, detect multiple failures. Specifically, at step 400, the process starts. At step 405, the compacted signatures of the test responses are provided to the system (e.g., computing system shown in FIG. 1 or architecture of FIGS. 5 and 6). At step 410, a determination is made as to whether the obtained signature (signature 1) is equal to the expected signature (signature 1). The expected value is automatically calculated during test pattern generation and the same is embedded in the patterns or in a memory in case of built-in self test. For example, any conventionally known Automatic Test Pattern Generation (ATPG) tool will determine the stimulus as well as the expected signature for each stimuli. Here, the algorithm used by the tool for calculating the expected signature and the hardware for signature calculation as described herein should to match for a given stimuli as is known in the art such that no further explanation is required for a complete understanding of the present disclosure. If they are equal, no errors have been detected as noted at step 415 and the process ends at step 420.

On the other hand, when it is determined that the obtained signature (signature 1) is not equal to the expected signature (signature 1), the process will continue to step 425. At step 425, the process will determine the difference between the obtained (final) signature (signature 1) and the expected signature (signature 1), and divide the result by "2" until an odd number is obtained. The number of divides will equal the row number and the odd number (prime number) will equal the column number.

Referring now to step 430, a determination is made as to whether the obtained signature (signature 2) is equal to the expected signature (signature 2). In this embodiment, signature 2 is a reverse order of signature 1. If the obtained signature (signature 2) is not equal to the expected signature (signature 2) are equal, no errors have been detected as noted at step 415 and the process ends at step 420. On the other hand, when it is determined that the obtained signature (signature 2) is not equal to the expected signature (signature 2), the process will continue to step 435. At step 435, the process will determine the difference between the obtained signature (signature 2) and the expected signature (signature 2), and divide the result by "2" until an odd number is obtained. The number of divides will equal the row number and the odd number (prime number) will equal the column number. In this way, it is possible to locate a memory cell or memory element capturing the faulty response.

At step 440, a determination is made as to whether the results provided in steps 425 and 435 are the same. If the values in steps 425 and 435 are the same, the process continues to step 445, at which stage the process determines there is a single error, and the exact location of the single error, e.g., row number and column number. If the results provided in steps 425 and 435 are not the same, the process continues to step 450, at which stage the process determines that there are multiple errors. Following both steps 445 and 450, the process proceeds to step 420.

By way of an illustrative non-limiting example to show the diagnostic improvement obtained with the compaction scheme described herein, consider the following:
  64×32 configuration;
  64 cycles (column) and 32 bits per cycle (row);
  Set row list to all prime numbers from 3 to 313;

Expected valued for 64 cycles: (32-bit binary to decimal);
set col_list {16630611 37172381 10293789 6442566
4085986 39593040 20964286 30596414 40459441
22620715 38824333 29157627 39445306 29085356
27372074 8514639 40183831 29018207 15486630
8784494 22975519 319999866 5965156 11847308
3038276 40110421 40752818 13946333 19670303
15173767 3306496 19216727 36952625 10522200
22825687 4855482 1711421 30532978 5084085
21320142 41465011 1075660 39765068 34610458
30570508 34563440 13432759 20919036 223432
18608817 41833095 2713234 31726898 13804967
5966643 36836291 30985987}

Expected Sum (signature): 205388898628.

To determine the exact location of a failure (which in this example is introduced in the $58^{th}$ cycle (e.g., 41833095)), bit number 18 from "1" to "0" is changed. In this example, the actual number at the $58^{th}$ cycle will now be 41702023 (i.e., $41833095-2^{(18-1)}$ and the obtained sum of the signature is 205352591684. The difference of the expected sum and the obtained sum is 36306944 (205352591684-205388898628). To obtain the exact location of the failure, it is possible to divide by "2" for every row until an odd number is obtained:

36306944/2=18153472 (row 1);
18153472/2=9076736 (row 2);
9076736/2=4538368 (row 3);
. . . ; and
554/2=277 (row 18).

In this exemplary case, the faulty flop is in the $18^{th}$ chain (e.g., row) and the cycle corresponds to the prime number 277 (e.g., $58^{th}$ prime number).

It is further noted that multiple faults can lead to an aliasing effect. As should be understood by those of skill in the art, in signal processing, aliasing is an effect that causes different signals to become indistinguishable (or aliases of one another) when sampled. To compensate for such potential aliasing effect, the following illustrative non-limiting example can be implemented:

Add "1" during the first cycle (+3), second cycle (+5), $9^{th}$ cycle (+29), etc.
Subtract "1" during the $11^{th}$ cycle (-37) (this is the cycle that includes a detected fail);
Add the first, second and ninth cycles, and subtract the $11^{th}$ cycle (e.g., 3+5+29-37=0);

The expected signature as noted from the above example is 205388898628 and the actual signature is 205388898628. In this case, the aliasing has passed.

Now, consider two sums as signatures, i.e., (i) prime numbers in regular order (e.g., 3, 5, 7, 11) and (ii) prime numbers in reverse order (e.g., 11, 7, 5, 3).

The original signature (e.g., sum with the prime numbers reversed) is 21765387002; whereas the actual signature is 217653867638. As should be understood in view of the disclosure herein, the expected signatures will be generated during pattern generation using known algorithms and embedded in the pattern. During testing of the circuit, the signatures are generated with the same algorithm using circuits and compared with the expected signatures which are stored in the pattern. In the present disclosure, though, prime numbers are used because they are not divisible by any other value, and, hence it is possible to obtain an exact location of any error. In this case, the second signature and the aliasing failed.

In embodiments, the processes described herein can provide parallel execution in order to reduce test time. By way of example, it is possible to divide the scan out cycle into smaller windows, e.g., if scan chain length=64, it can be divided into 8 windows of 8 cycles each. The multiplication and addition operations can then be run in parallel to obtain a final signature with 8 cycles instead of 64 cycles.

As shown in table 1 below, the number of columns can be used to determine the test time. For example, a maximum signature length of 43 can be achieved with 1,600,128 bits, 16 columns and 1000008 rows. Compared this to a maximum signature length of 45 being achieved with 2,600,208 bits, 26 columns and 1000008 rows. Accordingly, by implementing the processes described herein, significant test time reduction can be achieved since the number of columns= (number of cycles) are reduced as compared to the current techniques.

TABLE 1

| #No. of bits | #Columns | #Rows | Max. Sig_length |
|---|---|---|---|
| 160000 | 16 | 10000 | 36 |
| 260000 | 26 | 10000 | 38 |
| 1600128 | 16 | 100008 | 43 |
| 2600208 | 26 | 100008 | 45 |

In embodiments, the above method allows for stacking more rows and less columns during compaction. As should be understood by those of skill in the art, less columns means less cycles and reduced test time. Also, with this configuration, the change in signature length is limited even if the number of memory elements (flip-flops) changes by a large value. For example, there is greater than 1 million increase in bit count between row 3 and row 4 but the change in signature length is only 2.

Figure 5:
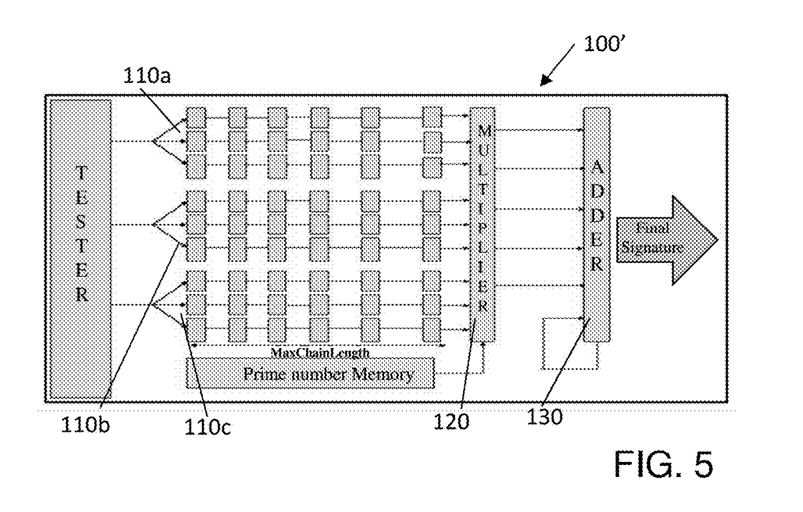
FIG. 5 shows a hardware implementation of the compaction scheme in accordance with aspects of the present disclosure.

FIG. 5 shows a hardware implementation of the compaction scheme in accordance with aspects of the present disclosure. In the hardware device 100' shown in FIG. 5, there are nine (9) channels (rows) which are grouped into three groups of three rows each, designated as reference numerals 110a, 110b, 110c. It should be understood by those of ordinary skill in the art, though, that the nine (9) channels can be grouped into other configurations. The results which are scanned out are provided to a multiplier 120 and an adder 130, which perform the multiplication and addition operations, respectively, in parallel, to provide the final signature. This provides significant reduction in test time compared to MISR schemes which require each individual row to be serially scanned out and analyzed for failures.

Figure 6:
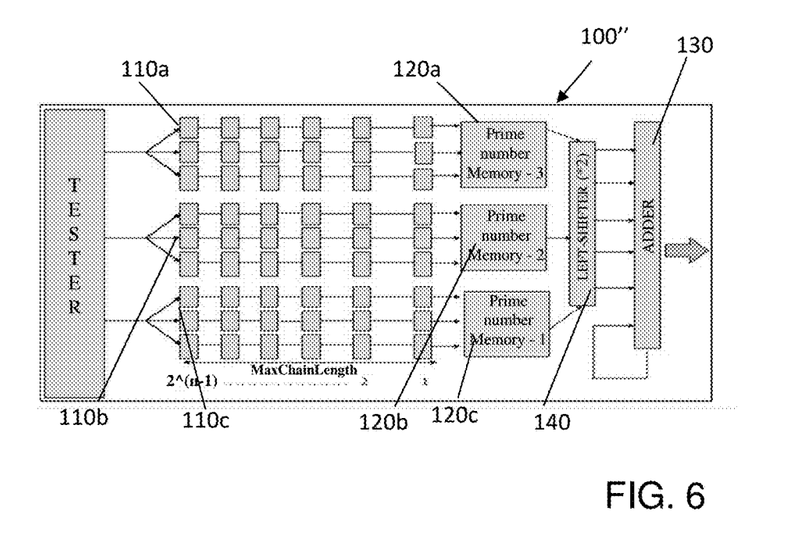
FIG. 6 shows a hardware implementation of the compaction scheme in accordance with additional aspects of the present disclosure.

FIG. 6 shows a hardware implementation of the compaction scheme in accordance with additional aspects of the present disclosure. In the hardware device 100" shown in FIG. 6, there are nine (9) channels (rows) which are grouped into three groups of three rows each, designated as reference numerals 110a, 110b, 110c; although the nine (9) channels can be grouped into other configurations. In this representation, the rows are designated with the prime numbers and the columns are provided with a weighting, e.g., 1, 2, . . . $2^{(n-1)}$. This scheme accommodates a large amount of channels which would otherwise lose compression.

Still referring to FIG. 6, the results of the test are scanned out to a respective prime number memory 120a, 120b, 120c. Although three individual prime number memories 120a, 120b, 120c are shown, the present disclosure also contemplates other configurations, e.g., a single memory, etc. In embodiments, the individual prime number memories 120a, 120b, 120c will store the prime numbers for the purpose of compaction of test response data which was captured in the memory elements (flip-flops), in addition to adding the prime number values assigned to each channel assigned to the respective memory. The test response data stored in the individual prime number memories 120a, 120b, 120c will then be fed to a shifter 140 which will shift each incoming cycle to the left, e.g., multiply by 2. This result is then provided to the adder 130 to provide the final signature. This again provides significant reduction in test time compared to MISR schemes, particular with large numbers of channels.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   arranging, using a computing system, bits of a memory cell into channels and clock cycles, wherein each clock cycle is assigned a successive prime number and each channel has a maximum chain length of "X" number of bits;
   performing, using the computing system, a test on the memory cell by applying stimulus and capturing a response in memory elements of the memory cell;
   scanning out, using the computing system, test results of the test performed on the bits for the each cycle and channel of the memory cell;
   calculating, using the computing system, a final signature of the test results using the successive prime number and a weighting afforded to the each channel; and
   identifying, using the computing system, any failures of the bits of the memory cell by comparing the final signature to an expected signature.

2. The method of claim 1, wherein each clock cycle of the memory cell is a representative of a column of bits and each channel is representative of a row of bits.

3. The method of claim 2, wherein after each clock cycle is scanned out, the test results are compressed and added to a next cycle.

4. The method of claim 3, wherein after all of the clock cycles are scanned out, the final signature is calculated by multiplication and addition operations of the successive prime number and the weighting afforded to each channel.

5. The method of claim 4, wherein each row has a weighting based on $2^{\wedge}$(n-number of rows remaining to be scanned out), where "n" represents the number of rows in a given configuration under test.

6. The method of claim 4, wherein the final signature is a column value (C) multiplied by a row value (R), where the row value (R) is representative of $\Sigma$(bit value*2 $^{\wedge}$ channel number and the channel value (C) is representative of prime cycle number.

7. The method of claim 1, wherein the calculating the final signature of the test results is provided by a multiplier and an adder of an integrated circuit.

8. The method of claim 1, wherein the calculating the final signature of the test results is provided by one or more multiple prime number memories, a shifter and adder of an integrated circuit, wherein the scanned out results are provided to the one or more multiple prime number memories to add prime number values assigned to each associated channel, an output of the one or more multiple prime number memories is provided to the shifter and an output of the shifter is provided to the adder.

9. The method of claim 1, further comprising identifying an exact location of the failure, after all of the cycles have been scanned out.

10. The method of claim 1, wherein the performing the test is one of performing manufacturing test by applying stimulus and capturing response in memory elements (flip-flops) and performing a built-in test on the bits of the memory cell.

11. A method comprising:
    providing, using a computing system, a column weight and a row weight for each column and row of bits of a memory cell;
    scanning out, using the computing system, results of a first cycle of the memory cells;
    calculating, using the computing system, a column value (C) and row value (R) for the first cycle;
    scanning out, using the computing system, results of any additional cycles of the memory cells;
    calculating, using the computing system, a column value (C) and row value (R) for each additional cycle of the memory cells;
    calculating, using the computing system, a final signature from by multiplication and addition operations performed with the column values and the row values obtained in the calculating steps; and
    scanning out, using the computing system, the final signature from the memory cells and comparing the final signature to an expected signature.

12. The method of claim 11, wherein the final signature is compared to an expected signature to determine if any errors have been captured in a test.

13. The method of claim 12, wherein the row weight is $2^{\wedge}$channel number (0 to N−1) and the column weight is a prime number 3 to Mth prime number, wherein N is a total number of channels.

14. The method of claim 12, wherein the column value (C) is equal to a prime number for each cycle (Prime(cycle #)) and the row value (R) is equal to $\Sigma$(bit value*$2^{\wedge}$channel number.

15. The method of claim 12, further comprising identifying an exact location of the error, after all of the cycles have been scanned out, by dividing by "2" a difference of the expected signature and the final signature until an odd number is obtained.

16. The method of claim 15, wherein the odd number is a prime number which is representative of a particular column in the memory cell of the error and an amount of times in which the difference is divided to obtain the prime number is representative of a row number of the error.

17. The method of claim 11, wherein the scan out cycle is divided into smaller windows and multiplication and addition operations are run in parallel to obtain a final signature.

18. A method comprising:
running, using a computing system, a test on a memory cell or memory element to obtain signatures of bits after all clock cycles have been run;
obtaining, using the computing system, compacted signatures of test responses of the test run on the circuit or memory cell;
determining, using the computing system, a difference between the obtained signature and an expected signature to identify an existence of an error; and
locating, using the computing system, the memory cell or memory element capturing the faulty response by dividing the result by "2" until an odd number is obtained, wherein a number of divides is representative of a row number of the memory cell and an odd number is representative of a column number of a fail.

19. The method of claim 18, further comprising comparing the difference between the obtained signature and an expected signature to a difference between a reverse of the obtained signature and the expected signature.

20. The method of claim 19, wherein when the results of the comparing are the same, a single error are determined to be detected and when the results of the comparing are not the same, several errors are determined to be detected.

* * * * *